(12) United States Patent
Basol

(10) Patent No.: US 8,580,603 B2
(45) Date of Patent: Nov. 12, 2013

(54) METHOD OF FABRICATING SOLAR CELLS WITH ELECTRODEPOSITED COMPOUND INTERFACE LAYERS

(75) Inventor: Bulent M. Basol, Manhattan Beach, CA (US)

(73) Assignee: EncoreSolar, Inc., Fremont, CA (US)

( * ) Notice: Subject to any disclaimer, the term of this patent is extended or adjusted under 35 U.S.C. 154(b) by 142 days.

(21) Appl. No.: 13/085,378

(22) Filed: Apr. 12, 2011

(65) Prior Publication Data

US 2011/0259424 A1 Oct. 27, 2011

Related U.S. Application Data

(60) Provisional application No. 61/342,942, filed on Apr. 21, 2010.

(51) Int. Cl.
*H01L 21/00* (2006.01)
(52) U.S. Cl.
USPC ............ 438/95; 438/93; 438/94; 136/252; 136/260; 136/264
(58) Field of Classification Search
USPC ...................................................... 438/93–95
See application file for complete search history.

(56) References Cited

U.S. PATENT DOCUMENTS

| | | | | |
|---|---|---|---|---|
| 4,345,107 A | * | 8/1982 | Fulop et al. | 136/255 |
| 4,388,483 A | * | 6/1983 | Basol et al. | 136/260 |
| 4,581,108 A | * | 4/1986 | Kapur et al. | 205/170 |
| 4,764,261 A | * | 8/1988 | Ondris et al. | 205/170 |
| 4,950,615 A | * | 8/1990 | Basol et al. | 438/95 |
| 5,320,736 A | | 6/1994 | Stickney et al. | |
| 5,489,372 A | | 2/1996 | Hirano | |
| 6,023,020 A | | 2/2000 | Nishitani et al. | |
| 6,137,048 A | * | 10/2000 | Wu et al. | 136/260 |
| 2007/0215195 A1 | | 9/2007 | Buller et al. | |
| 2008/0280030 A1 | * | 11/2008 | Van Duren et al. | 427/74 |
| 2009/0283415 A1 | | 11/2009 | Aksu et al. | |

OTHER PUBLICATIONS

Cunningham, D. et al. (2002, e-pub. Jan. 29, 2002). "Cadmium Telluride PV Module Manufacturing at BP Solar," *Progress in Photovoltaics: Research and Applications* 10:159-168.
Rios-Flores, A. et al. (2010, e-pub. Apr. 8, 2010). "A Study of Vapor CdCl2 Treatment by CSS in CdS/CdTe Solar Cells," *Solar Energy* 86:1020-1026.
International Search Report mailed Jul. 8, 2011, for PCT Application No. PCT/US11/32130, filed Apr. 12, 2011, three pages.

* cited by examiner

*Primary Examiner* — Bac Au
(74) *Attorney, Agent, or Firm* — Morrison & Foerster LLP

(57) ABSTRACT

A method of fabricating a solar cell involves electroplating a Group IIB-VIA material as a first or sub-layer over a junction partner layer, and then forming a second layer, also of a Group IIB-VIA material over the sub-layer. Both the sub-layer and the second layer comprise Te. The electroplating is performed at relatively low temperatures, as for example, below 100° C. Forming the sub-layer by low temperature electroplating produces a small grained compact film that protects the interface between the sub-layer and the junction partner during the formation of the second layer. The second layer may be formed by physical vapor deposition or ink deposition. A solar cell has a first layer of a stoichiometric Group IIB-VIA material formed on a CdS film, and a second layer of a Group IIB-V1A material. Both the first and second layers contain Te. The first layer may comprise CdTe with a grain size small than 0.5 microns and the second layer may comprise CdTe with a grin size in the range of 1-5 microns.

11 Claims, 5 Drawing Sheets

METHOD OF FABRICATING SOLAR CELLS WITH ELECTRODEPOSITED COMPOUND INTERFACE LAYERS

CROSS-REFERENCE TO RELATED APPLICATION

This application claims benefit of U.S. Provisional Application No. 61/342,942, filed Apr. 21, 2010, the contents of which are incorporated by reference herein in their entirety for all purposes.

FIELD OF THE INVENTION

Embodiments of the present invention relate generally to methods for preparing thin films of Group IIB-VIA compound semiconductors for radiation detector and photovoltaic applications.

BACKGROUND

Solar cells and modules are photovoltaic (PV) devices that convert sunlight energy into electrical power. The most common solar cell material is silicon (Si). However, lower cost PV cells may be fabricated using thin film growth techniques that can deposit solar-cell-quality polycrystalline compound absorber materials on large area substrates using low-cost methods.

Group IIB-VIA compound semiconductors comprising some of the Group IIB (Cd, Zn, Hg) and Group VIA (O, S, Se, Te, Po) materials of the periodic table are excellent absorber materials for thin film solar cell structures. Especially CdTe has proved to be a material that can be used in manufacturing high efficiency solar panels at a cost below $1/W.

FIGS. 1A and 1B show the two different device structures employed in CdTe based solar cells. FIG. 1A is a "super-strate" structure, wherein the light enters the device through a transparent sheet that it is fabricated on. FIG. 1B depicts a "sub-strate" structure, wherein the light enters the device through a transparent conductive layer deposited over the CdTe absorber which is grown over a substrate.

In fabricating the "super-strate" structure 10 of FIG. 1A, a transparent conductive layer (TCL) 12 is first deposited on a transparent sheet 11. Then a junction partner layer 13 is deposited over the TCL 12. A CdTe absorber film 14 is formed on the junction partner layer 13. Then an ohmic contact layer 15 is deposited on the CdTe absorber film 14, completing the solar cell. As shown by arrows 18 in FIG. 1A, light enters this device through the transparent sheet 11. In the "super-strate" structure 10 of FIG. 1A, the transparent sheet 11 may be glass or a high temperature material (e.g. high temperature polymer such as polyimide) that has high optical transmission (such as higher than 80%) in the visible spectra of the sun light. The TCL 12 is usually a transparent conductive oxide (TCO) layer comprising any one of tin-oxide, cadmium-tin-oxide, zinc-tin-oxide, indium-tin-oxide, and zinc-oxide which may be doped to increase their conductivity. Multi layers of these TCO materials as well as their alloys or mixtures may also be utilized in the TCL 12. The junction partner layer 13 is typically a CdS layer. The ohmic contact 15 is made of a highly conductive metal such as C, Mo, Ni, Cr, their nitrides or a doped transparent conductive oxide. The rectifying junction, which is the hearth of this device, is located near the interface 19 between the CdTe absorber film 14 and the junction partner layer 13.

In the "sub-strate" structure 17 of FIG. 1B, the ohmic contact layer 15 is first deposited on a sheet substrate 16, and then the CdTe absorber film 14 is formed on the ohmic contact layer 15. This is followed by the deposition of the junction partner layer 13 and the transparent conductive layer (TCL) 12 over the CdTe absorber film 14. As shown by arrows 18 in FIG. 1B, light enters this device through the TCL 12. There may also be finger patterns (not shown) on the TCL 12 to lower the series resistance of the solar cell. The sheet substrate 16 does not have to be transparent in this case. Therefore, the sheet substrate 16 may comprise a sheet or foil of metal, glass or polymeric material.

The CdTe absorber film 14 of FIGS. 1A and 1B may be formed using a variety of methods. For example, U.S. Pat. No. 4,388,483 granted to B. M. Basol et al., describes the fabrication of a CdS/CdTe solar cell wherein the thin CdTe film is obtained by a cathodic compound electrodeposition technique at low electrolyte temperatures, and then the as-deposited n-type CdTe film is type-converted to p-type through a high temperature annealing step to form the rectifying junction with the underlying CdS layer. The compound electrodeposition or electroplating technique typically uses acidic aqueous electrolytes and forms high quality rectifying junctions after the type-conversion step yielding high quality solar cells and modules with conversion efficiencies exceeding 10% (D. Cunningham et al, "CdTe PV module manufacturing at BP solar", Progress in Photovoltaics, vol. 10, p. 159 (2002)).

An alternative approach to CdTe formation is physical vapor deposition (PVD), which may be a close-spaced-sublimation method or a vapor transport method. In this technique CdTe granules are vaporized at high temperatures (>600° C.) in a source, and the vapors obtained this way are directed towards a surface of a base, where they condense and form a CdTe layer. The base is typically kept at elevated temperatures of over 500° C. during this process and the surface of the base on which the CdTe layer is deposited comprises a junction partner layer such as a CdS layer. The deposition rate is very high in these methods reaching and even exceeding the level of 1 micron/minute. However, these high temperature methods use large amount of electricity and efficient solar cell fabrication requires use of a thicker CdTe layer (typically a thickness of larger than 3 microns) compared to the electrodeposition technique. In fact, the highest efficiency solar cell, which was fabricated using a PVD method, had a CdTe thickness of larger than 5 microns.

In yet another approach, which is called the "two-stage" approach, a CdTe layer may be formed by first depositing a precursor layer on a base, and then by annealing or reacting this precursor layer to form a crystallized CdTe compound layer, which is polycrystalline in nature. For example, screen printing or ink deposition techniques may be used to deposit pastes or inks, comprising Cd and Te nano-particles or CdTe nano-particles, on CdS coated substrates in the form of a precursor layer. This precursor layer is porous and since it is not a well fused CdTe compound film with good grain structure, it cannot be used for making a solar cell in its as-deposited form. In the second stage of the process, the precursor layer is heated up to elevated temperatures to promote a reaction between the Cd and Te particle species or to promote sintering and grain growth between the CdTe particles within the precursor layer. Cadmium chloride ($CdCl_2$) is often used as a sintering agent to enhance grain growth during or after this annealing or sintering step. As a further example of prior art two-stage techniques, U.S. Pat. No. 4,950,615 discloses a method involving electrodeposition of a Te layer on the surface of a CdS film, followed by electrodeposition of a Cd layer on the Te layer surface during the first stage of the process. During the second stage, the two layers are heated up and reacted to obtain CdTe and form a CdTe/CdS rectifying junction.

FIG. 2 depicts the first general step of an exemplary prior art "two-stage" process wherein a granular precursor layer 20 comprising particles is deposited on the junction partner layer 13 such as a CdS layer to form a stack 21. As reviewed above, the prior art precursor layers may contain one of; i) a mixture of Cd and Te nano-particles, ii) CdTe nano-particles, and, iii) a Te/Cd stack comprising a Te layer and a Cd layer. During the second stage of the process, the stack 21 is heated up to a temperature of 400-600° C. to convert the granular precursor layer 20 into a fused polycrystalline CdTe layer. As the CdTe layer forms, it also forms the rectifying junction with the junction partner layer 13 at the interface 19 shown in FIG. 1A. One problem faced in two-stage approaches is the fact that the surface of the junction partner layer 13 is exposed to various impurities and fluxing agents (such as $CdCl_2$) present in the granular precursor layer 20 during the second stage of the process as the CdTe compound is formed at high temperature. This deteriorates the quality of the interface 19 by the time the p-type CdTe layer is fully formed and the rectifying junction is established between the CdTe layer and the junction partner layer 13 near the interface 19. A low quality interface 19 lowers the electronic and structural quality of the rectifying junction and therefore, lowers the efficiency of the solar cells, especially lowering their voltage and fill factor values.

As the above review demonstrates, there is a need to develop low cost methods for processing CdTe based solar cells with high quality rectifying junctions. Described embodiments provide an inexpensive method for the formation of thin Group IIB-VIA compound absorbers, and provide methods of processing solar cells using these compound absorber layers.

DETAILED DESCRIPTION OF THE PREFERRED EMBODIMENTS

Figure 1A:
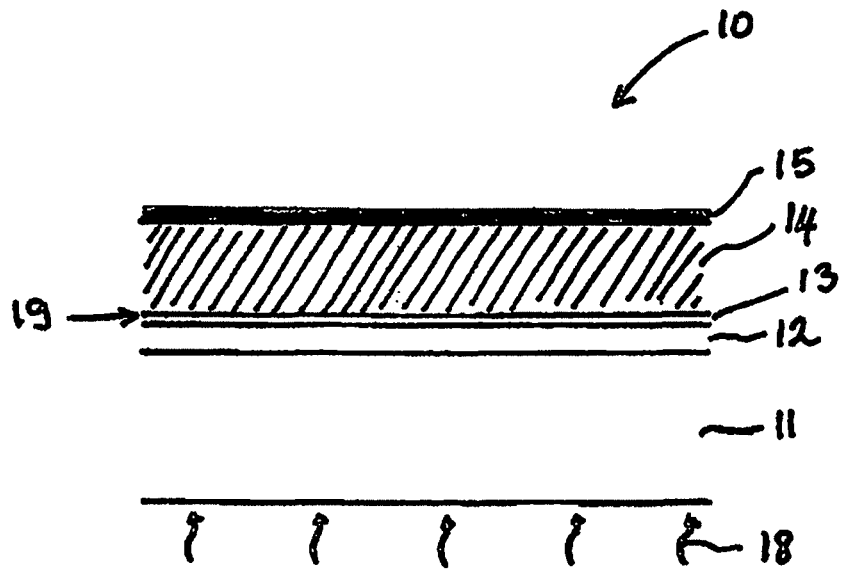
FIG. 1A is a cross-sectional view of a prior art CdTe solar cell with a "super-strate structure".

In some embodiments the present inventions form a solar cell of "super-strate" structure by forming the compound absorber layer in two process steps. During the first step of the process a CdTe sub-layer is electrodeposited on a surface of a junction partner layer. The CdTe sub-layer is deposited at a temperature below 100° C., and being a small grained compact film, it forms and protects the atomically clean interface between the CdTe sub-layer and the junction partner layer during the second step of the process when the rest of the solar cell absorber is deposited. During the second step of the process, a second CdTe layer is formed on the CdTe sub-layer. The process for the formation of the second CdTe layer may involve temperatures typically in excess of 400° C. Prior to the formation of the second CdTe layer, the CdTe sub-layer may be doped with a p-type dopant, in which case it becomes the source to dope the second CdTe layer during or after the deposition of the second CdTe layer.

Another embodiment provides methods to fabricate solar cells of "sub-strate" structure by forming a compound absorber layer in two process steps. During the first step of the process a Group IIB-VIA compound containing interlayer is deposited, preferably by an electrodeposition technique, on a surface of a contact film. The Group IIB-VIA compound containing interlayer may provide p-type doping and/or electron reflector capability to the device structure. During the second step of the process, a top Group IIB-VIA compound containing layer is formed on the interlayer. A junction partner layer and a transparent conductive layer may then be deposited over the top Group IIB-VIA compound containing layer to finish the device.

Reference will now be made to the drawings and to some specific examples. Such examples should be construed as exemplary embodiments for the purpose of illustration and not by way of limitation.

As reviewed above, the electrodeposition method is carried out in electrolytes typically kept at temperatures below 100° C. Other control parameters for electroplating include as representative, non-limiting examples: deposition current density between 0.01-0.5 mA (milliamps)/$cm^2$, deposition voltage (with respect to a silver-silver chloride reference electrode) in the range of −0.4 volts to −0.7 V (volts); Te concentration in the range of 5-50 ppm; and a Cd concentration in the range of 0.1 to 2.0 M (molar). Being a slow process carried out at low temperature, electrodeposition yields CdTe films with substantially 100% density and small fibrous grains. Furthermore, the interface established between a junction partner layer and a CdTe sub-layer electrodeposited on the junction partner layer is atomically clean and compositionally sharp since the electroplating electrolyte chemically cleans the surface of the junction partner layer just before the first nano-layer of the CdTe compound is deposited on it. Inter-diffusion between the CdTe sub-layer and the junction partner layer at that interface is also minimal, yielding a compositionally sharp interface, since the process is carried out at low temperature.

Figure 3A:
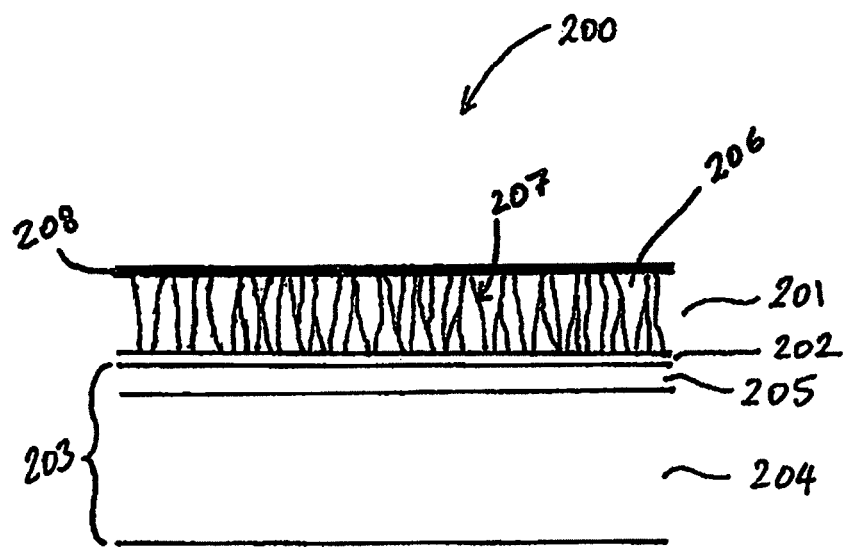
FIG. 3A is a cross-sectional view of a solar cell employing an electrodeposited CdTe absorber layer.
Figure 3B:
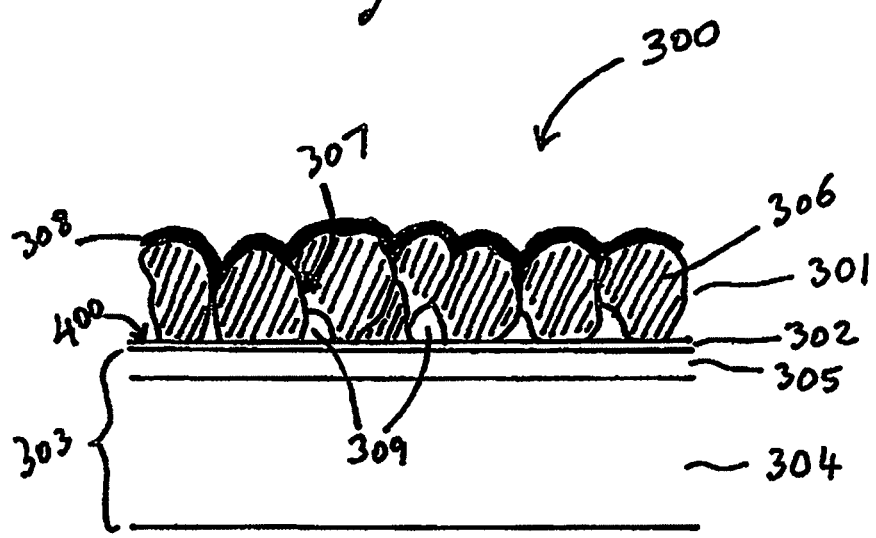
FIG. 3B is a cross-sectional view of a solar cell employing a physical vapor deposited CdTe absorber layer.

FIGS. 3A and 3B depict two exemplary CdTe solar cells formed using two different CdTe growth techniques and demonstrate some fundamental differences observed between these techniques. FIG. 3A shows an exemplary CdTe solar cell 200 with a "super-strate" structure, wherein the whole thickness of a CdTe absorber film 201 is electrodeposited on a CdS layer 202, which in turn is deposited on a base 203. The base 203 comprises a glass substrate 204 and a transparent conductive oxide layer 205. As can be seen from this figure, the CdTe absorber film 201 is substantially 100% dense and compact with a smooth surface, and it comprises small fibrous grains 206, which may have widths in the range of 0.02-0.5 microns, depending on the thickness, thinner films having smaller grain size. Grain boundaries 207 between the fibrous grains 206 are tight with no voids. The exemplary CdTe solar cell 200 has a back contact 208 (ohmic contact) which is made of a conductor or a conductive stack comprising a highly conductive metal such as Cu, Mo, Ni, Cr, their nitrides, C (such as graphite) or a doped transparent conductive oxide. Since the CdTe absorber film 201 is smooth and substantially 100% dense, efficient solar cells may be fabricated on such layers even if their thickness is as low as about 1 micron. The exemplary thickness depicted in FIG. 3A for the CdTe film 201 may be about 1-2 microns. However, electrodeposition of a 1-2 micron thick CdTe layer may take more than about 3 hours of processing time for large substrates (such as substrates as large as 2 ft in one dimension) used in manufacturing.

FIG. 3B depicts another CdTe solar cell 300, wherein the CdTe absorber layer 301, which may also be 1-2 microns thick, is deposited by a high temperature PVD method on a CdS film 302, which was previously deposited on a cell base 303. The cell base 303 comprises a glass sheet 304 and a transparent conductive oxide film 305. As can be seen from this figure, the CdTe absorber layer 301 is rough and porous. It comprises large grains 306, which may have widths in the range of 1-5 microns. Some of the grain boundaries 307 end at voids 309, which are generally located at the interface 400 between the CdTe absorber layer 301 and the CdS film 302, where the active rectifying junction of the solar cell is located. The exemplary CdTe solar cell 300 has a back contact film 308 (ohmic contact) which is made of a conductor or a conductive stack comprising a highly conductive metal such as Cu, Mo, Ni, Cr, their nitrides, C or a doped transparent conductive oxide. The poor morphology of the CdTe absorber layer 301 may result in shorting of the back contact film 308 to the CdS film 302 through the grain boundaries 307 and voids 309.

The poor morphology of the CdTe absorber layer 301 stems from the fact that the PVD processes are carried out at high deposition temperatures, typically over 450° C., and even over 500° C. to be able to grow stoichiometric CdTe, i.e. pure CdTe compound with no free elemental Cd and/or Te. At high temperatures, any excess Cd and Te evaporates away and only the reacted CdTe, which has a low vapor pressure, stays on the surface of the CdS film 302. If PVD is carried out at a low temperature, such as at or below 100° C., it forms a dense layer comprising a mixture of Cd, Te and CdTe, rather than the pure stoichiometric CdTe. Electrodeposition method, however, has the unique capability of depositing stoichiometric CdTe compound even at room temperature because free energy of formation of CdTe compound allows Cd species in the plating electrolyte to react with electrodeposited monolayer of Te, forming CdTe without much energy input from the temperature of the plating bath. This process also assures that one Cd atom reacts with only one Te atom and thus the resulting compound is stoichiometric, i.e. Cd/Te molar ratio is 1.0.

Referring back to FIG. 3B, the rough morphology of the CdTe absorber layer 301, the presence of voids 309, and the electrical shorting of the back contact film 308 to the CdS film 302 through the shortened and loose grain boundaries 307 and through voids 309 do not allow efficient solar cell fabrication on such CdTe absorber layers 301, if its thickness is below about 2.5 microns. Therefore, high temperature PVD methods deposit 3-5 micron thick CdTe absorbers to be able to fabricate efficient solar cells. Considering the fact that Te is an extremely rare material, use of a thick CdTe absorber layer increases the cost of materials, increases the usage of toxic Cd and hurts the long term feasibility of these technologies although their throughput is very high since they can grow CdTe at speeds of 1-10 micron/minute.

Figure 4A:
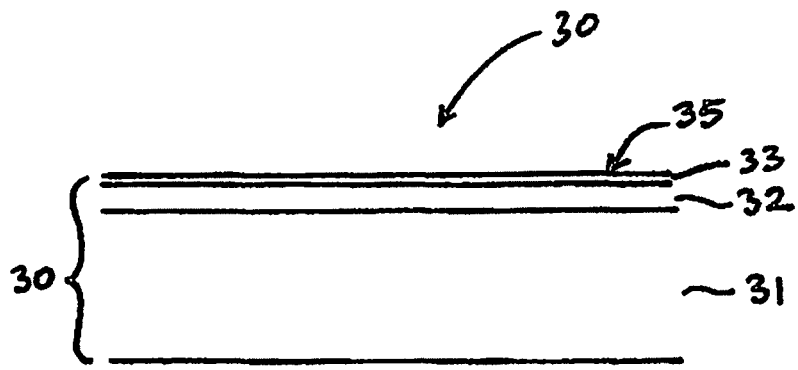
FIG. 4A is a cross-sectional view of a schematic drawing depicting a stack.
Figure 4B:
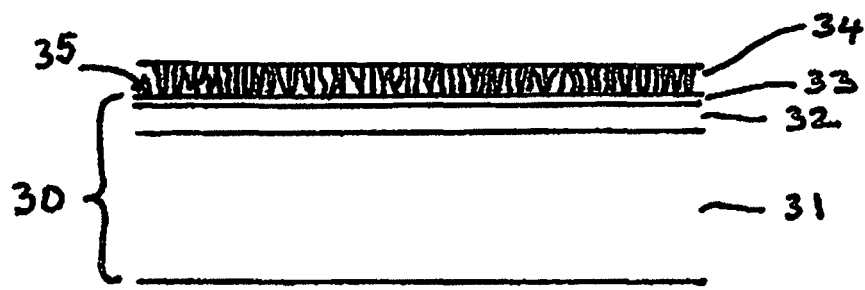
FIG. 4B shows a thin CdTe sub-layer electrodeposited on the stack of FIG. 4A.
Figure 4C:
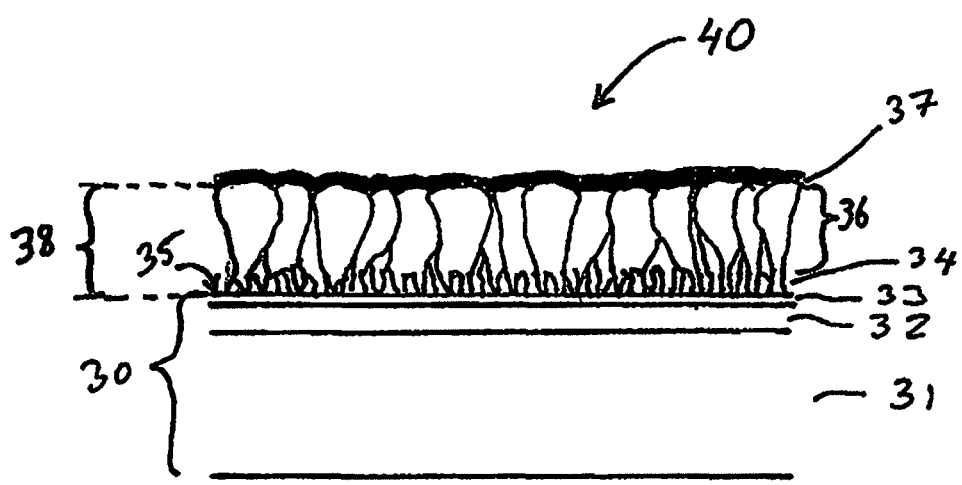
FIG. 4C shows a cross-sectional view of a solar cell formed after depositing a second CdTe layer on the electrodeposited CdTe sub-layer.

FIGS. 4A, 4B and 4C describe a preferred embodiment for the fabrication of a Group IIB-VIA based solar cell, such as a CdTe solar cell, with a "super-strate" structure. It should be noted that although the "CdS/CdTe" solar cell structure as is described as a preferred embodiment by way of example, the description is also applicable in general to a "junction partner/Group IIB-VIA" solar cell, wherein the junction partner may comprise at least one of a metal selenide, sulfide, oxide or telluride, and the Group IIB-VIA compound may include any one or more of the Group JIB (Cd, Zn, Hg) and VIA (O, S, Se, Te, Po) materials of the periodic table, and may also include electrical and/or structural dopants such as Mg, Mn, P, Sb, Cu, As, etc. It should be noted that materials such as Zn, Mg and Mn increase the bandgap values of Group IIB-VIA compounds such as CdTe, while materials such as P, Sb, Cu and As are p-type dopants that reduce their resistivities.

Referring to FIG. 4A, the stack 30, over which the CdTe compound would be deposited to form a solar cell, comprises a transparent sheet layer 31 such as glass, a transparent and conductive layer 32 such as a layer of fluorine doped tin oxide, and a junction partner layer such as a CdS film 33 with a top surface 35. In the first step of the process, a sub-layer 34 of, for example CdTe (hereinafter referred to as the CdTe sub-layer 34) is electrodeposited on the top surface 35 of the CdS film 33. As stated above, instead of CdTe, the sub-layer 34 may comprise other Group IIB-VIA compounds such as ZnTe, CdZnTe, CdMnTe, CdTeS, CdZnTeS, ZnTeS and CdMgTe. The CdTe sub-layer 34 is preferably deposited at a temperature of 100° C. or lower; it is substantially 100% dense; and it has sub-micron size fibrous grains with grain sizes smaller than 0.5 microns, preferably smaller than 0.3 microns and most preferably smaller than about 0.2 microns. The thickness of the CdTe sub-layer may be in the range of 0.001-1 micron, preferably in the range of 0.01-0.5 microns and most preferably in the range of 0.05-0.3 microns. The electrodeposited CdTe sub-layer 34 is made of a stoichiometric CdTe compound and it establishes an atomically clean and compositionally sharp junction at the top surface 35 of the CdS film 33, between the CdS film 33 and the CdTe sub-layer 34. It should be noted that the structure shown in FIG. 4B as-is cannot produce an efficient solar cell if the thickness of the CdTe sub-layer 34 is not adequate to absorb more than about 80% of the solar spectra, i.e. the CdTe sub-layer 34 thickness is less than about 1 micron. Since the most preferred range of CdTe sub-layer 34 thickness is 0.05-0.3 microns, high efficiency solar cell fabrication requires the second step of the process described below. It should be noted that the cost of the first step of the process explained above is low because the thickness of the electrodeposited CdTe sub-layer is small and can be efficiently processed using the slow electrodeposition technique.

During the second step of the process, a second layer 36 (for example a CdTe layer) is formed on top of the electrodeposited CdTe sub-layer 34 using a fast process (e.g., a physical vapor deposition process, or a nano-ink printing process), producing the composite CdTe layer 38 as shown in FIG. 4C. The second layer 36 (hereinafter referred to as the second CdTe layer 36) may be formed at the elevated temperatures of higher than 400° C., preferably higher than 450° C. Consequently, it comprises large grains as shown in the figure. The composite CdTe layer 38 may have small and dense grains near the surface 35 where the rectifying junction is, and it has larger grains closer to the back contact 37 (ohmic contact). Since the second CdTe layer 36 may be formed at high temperature, the grains of the CdTe sub-layer and the grains of the second CdTe layer may fuse at the interface where they meet. The surface 35 of the CdS film 33, where the rectifying junction eventually forms, is protected by the electroplated CdTe sub-layer 34 (which comprises a stoichiometric CdTe material) during the growth of the second CdTe layer 36, and therefore does not get exposed to chemical impurities, fluxing agents, etc. which may be introduced by the second step of the process. Furthermore, the compact and small grained nature of the electrodeposited CdTe sub-layer 34 forms a barrier against possible electrical shorts between the back contact layer 37 and the CdS film 33 or the transparent and conductive layer 32.

As a further embodiment, the stacked structure formed after the deposition of the CdTe sub-layer 34 onto the CdS film 33 may be annealed at a temperature in the range of 250-550° C., preferably in the range of 300-525° C., most preferably in the range of 350-500° C. before the deposition of the second CdTe layer 36 over the CdTe sub-layer 34. Annealing may be carried out for a period of 1-30 minutes, through the use of ovens, lasers, microwave energy and other means providing high temperatures. The annealing step may be carried out in an inert gas environment such as in a nitrogen, helium, argon or vacuum environment. However, the annealing environment may preferably comprise an oxidizer such as oxygen. During annealing the structurally tight grain boundaries of the small grained CdTe sub-layer 34 may get further passivated. If there is an oxidizer in the annealing environment, further passivation may be achieved through the formation of native oxides of Cd and Te.

As a result of this process step, the annealed CdTe sub-layer 34 may form an even better barrier against species that may otherwise be diffusing to the interface between the CdS film 33 and the CdTe sub-layer 34 during the rest of the process flow used for the formation of a solar cell. For example, after the deposition of the second CdTe layer 36, an "activation process" may be carried out to improve the electronic and structural quality of this CdTe layer. In prior-art techniques the "activation process" has been applied to CdTe films deposited directly on CdS films and it typically involved deposition of a $CdCl_2$ layer on the CdTe film and heat treatment at a temperature in excess of 350° C. Alternately, the CdTe film was exposed to a $CdCl_2$ vapor flux or Cl-containing vapor flux at elevated temperatures. Other halides such as iodine (I) and bromine (Br) may also be used in such activation processes. During the heat treatment period of such a prior-art "activation process", the $CdCl_2$ and/or Cl species improve the electronic/structural quality of the CdTe films by diffusing through their grain boundaries and possibly into their grains, but at the same time they also diffuse to the CdS/CdTe interface and cause intermixing between the two materials. Such intermixing partially consumes the CdS film and forms a CdTeS material with an optical bandgap lower than that of CdS at the CdS/CdTe interface. Lower optical bandgap increases optical absorption and reduces the amount of light coming through the CdS layer and reaching the CdTe absorber. If the intermixing between the CdS and CdTe layers is not minimized, the current, voltage and conversion efficiency values of the resulting solar cells get negatively impacted.

By employing an electroplated CdTe sub-layer 34 as a cap layer over the CdS film 33, the surface 35 of the CdS film 33, where the rectifying junction of the solar cell eventually forms, is protected during the deposition of the second CdTe layer 36, as well as during its optimization by use of techniques such as the "activation process" described above. The compact and small grained CdTe sub-layer 34 forms a barrier against the diffusion of the $CdCl_2$ and/or Cl species, from the second CdTe layer 36, to the surface 35 of the underlying CdS film 33. As discussed before, such a barrier to diffusion may become even more effective if the CdTe sub-layer 34 is previously annealed in an oxygen containing atmosphere or environment forming Cd and/or Te oxides at its grain boundaries. The oxide materials at the grain boundaries constitute a good barrier against diffusion of the $CdCl_2$ and Cl species. Therefore, by employing the teachings of this embodiment, the electronic and structural quality of the second CdTe layer 36, which forms a substantial portion of the solar cell absorber layer, can be improved and optimized using approaches such as the "activation process", without negatively impacting the CdS layer surface near where the rectifying junction of the finished solar cell is located. It should be noted that, instead of or in addition to oxygen, Se may be used in the annealing environment of the CdTe sub-layer 34, Se being another Group VIA material. Also, oxidation of the CdTe sub-layer 34 grain boundaries may be achieved through chemical or electrochemical means instead of annealing. In these approaches the CdTe sub-layer 34 may be exposed to oxidizing chemical solutions with or without application of voltage. For example, under anodic voltage CdTe may be oxidized even in water.

If the sub-layer 34 comprises materials such as Zn, Mg, and Mn, then the sub-layer 34 also provides a high bandgap interface at the junction with the CdS film 33, since the bandgap values of compounds containing Zn, Mg, or Mn are larger than the bandgap of CdTe which is about 1.5 eV. This may increase the voltage of the resulting solar cells.

It is also possible to introduce p-type dopants such as Cu, Sb, P, and As into the CdTe sub-layer 34 as further embodiments of FIGS. 4A-4C. One way of achieving this is introducing the dopants into the electrodeposition solution. For example, Cu can be included in the formulation of the CdTe electroplating solution which may comprise a Cd source such as Cd-sulfate salt, a Te source such as Te-oxide powder and a Cu source such as Cu-chloride salt dissolved in water. During electrodeposition process a small amount of (preferably less than about 2 atomic percent, more preferably less than about 1 atomic percent and most preferably less than about 0.5 atomic percent) Cu deposits along with CdTe and gets included into the CdTe sub-layer 34 without disturbing its Cd/Te atomic ratio which stays substantially near 1.0. As a result, the sub-layer 34 becomes a p-type dopant source to the composite CdTe layer. During the growth of the second CdTe layer 36 at the elevated temperatures, the dopant in the CdTe sub-layer 34 may diffuse into the second CdTe layer 36 and improve its p-type character, which is very important for high efficiency solar cell fabrication.

It should be noted that a prior art method of doping a CdTe film in a thin film solar cell structure as disclosed at page 1022 of the reference; A. Rios-Flores et al., "A study of vapor $CdCl_2$ treatment by CSS in CdS/CdTe solar cells", Solar Energy, vol: 84, pp. 1020-1026, (2010), involves three process steps; i) deposition of the CdTe film on a junction partner layer using a fast process such as PVD, ii) deposition of a Cu source such as a film of Cu on the exposed surface of the CdTe film, iii) annealing at temperatures of over 200° C. to drive the Cu into the CdTe film. In this prior-art approach, the dopant (Cu) is diffused into an already formed CdTe layer. Since the grain boundaries are fast diffusion locations, most of the dopants diffuse through the grain boundaries with limited diffusion into the bulk of the grains. In contrast, in embodiment of FIGS. 4A-4C, the dopant is provided from the CdTe sub-layer 34 to the second CdTe layer 36 during the growth of the second CdTe layer 36 at temperatures over 200° C., typically over 400° C. and preferably over 450° C. Therefore, inclusion of the dopant into the bulk of the grains is much easier and the doping efficiency is higher than the prior art technique.

The thickness of the second CdTe layer 36 may range between 0.2-2 microns, preferably between 0.5-1.5 microns, most preferably between 0.5-1 microns. The thickness of the composite CdTe film 38 may range between 0.5-2.5 microns, preferably between 0.6-2 microns, most preferably between 0.7-1.3 microns. A variety of methods may be used to deposit the second CdTe layer 36 on top of the CdTe sub-layer 34. In a preferred embodiment, the second CdTe layer 36 may be deposited by a PVD method at temperatures exceeding 400° C. In this method, vapors from a CdTe source are directed onto the CdTe sub-layer 34 and they condense onto the CdTe sub-layer 34 forming the second CdTe layer 36. The CdTe sub-layer 34 protects the top surface 35 of the CdS film 33 from the elemental vapors of Cd and Te present in the vapors coming from the CdTe source. There may also be $CdCl_2$ vapors present in the environment to help fuse the growing grains in this step of the process.

Figure 2:
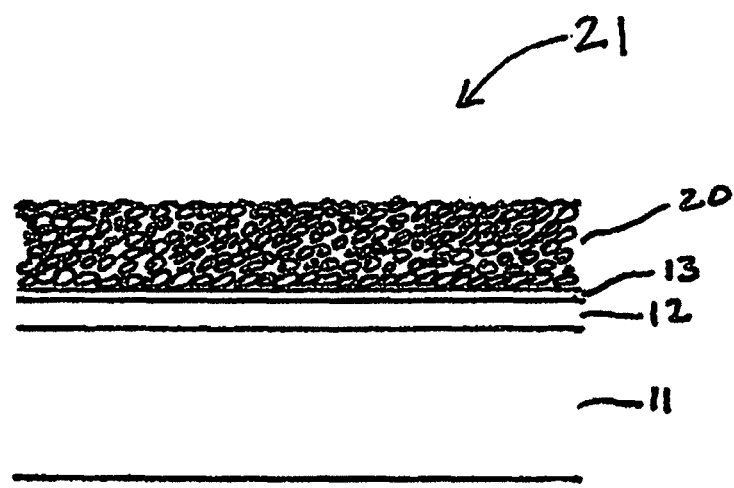
FIG. 2 is a cross-sectional view of a prior art stack comprising a granular precursor layer deposited on a CdS film.

In another preferred embodiment, the second CdTe layer 36 may be grown on the CdTe sub-layer 34 using a two-stage process. For example, a precursor layer similar to the granular precursor layer 20 of FIG. 2 may be deposited on the CdTe sub-layer 34 of FIG. 4B during a first stage of the two stage process. For example, screen printing or ink deposition techniques may be used to deposit pastes or inks, comprising Cd and Te nano-particles or CdTe nano-particles, on the CdTe sub-layer to form the precursor layer. During a second stage of the two-stage process, this precursor layer may be heated up to a temperature of 400° C. or higher to form the second CdTe layer 36 of FIG. 4C. In this case the CdTe sub-layer 34 protects the top surface 35 of the CdS film 33 from elemental Cd, elemental Te, fluxing agents such as $CdCl_2$, and other chemicals that may be present in the precursor layer. It should be noted that nano-particle inks or pastes which may be used as the source materials for the deposition of the granular precursor layer 20 of FIG. 2, by techniques such as spraying, ink writing, curtain coating and doctor blading, employ many chemical agents such as wetting agents, dispersion agents, solvents, de-flocculation agents, etc. in the formulation of the inks or pastes. Such chemicals, when deposited directly on a CdS surface contaminate this surface, which later accommodates the rectifying junction. Such contamination deteriorates the electronic quality of the junction and reduces the conversion efficiency of the solar cells. It is also known that excessive amount of $CdCl_2$ present at a CdS/CdTe interface promotes intermixing between the CdTe and CdS layers and reduces the quality of the junction.

While the sub-layer 34 and the second layer 36 are described above as both being CdTe, alternative embodiments are also possible as summarized in the following table. In the preferred embodiments, the sub-layer 34 and second layer 36 are both selected from Group IIB-VIA compounds wherein both sub-layer 34 and second layer 36 include Te.

| Sub-layer 34 | Second layer 36 |
| --- | --- |
| CdTe | CdTe |
| CdTe | ZnTe |
| ZnTe | CdTe |
| CdZnTe | CdZnTe |
| CdZnTe | CdTe |
| CdTe | CdZnTe |
| ZnTe | CdZnTe |
| CdMnTe | CdMnTe |
| CdTe | CdMnTe |
| ZnTe | CdMnTe |
| CdZnTe | CdMnTe |
| CdMnTe | CdTe |
| CdMnTe | CdZnTe |
| CdMgTe | CdMgTe |
| CdTe | CdMgTe |
| ZnTe | CdMgTe |
| CdZnTe | CdMgTe |
| CdMnTe | CdMgTe |
| CdMgTe | CdTe |
| CdMgTe | CdZnTe |
| CdMgTe | CdMnTe |

Other benefits of the present embodiments may be understood referring back to the device structure 40 shown in FIG. 4C. In the device structure of FIG. 4C there are no voids at the interface of the composite CdTe layer 38 and the CdS film 33 because that interface is established by the small grained CdTe sub-layer 34 at low temperature. Even if a high temperature process, such as PVD, is utilized to deposit the second CdTe layer 36, and even if the total thickness of the composite CdTe layer 38 is in the 1-2 microns range, unlike the prior art case shown in FIG. 3B, the second CdTe layer 36 does not show voiding and excessive surface roughness. The reason for this is the fact that the second CdTe layer 36 is grown on the CdTe sub-layer 34 rather than on a non-CdTe surface (such as on the surface of a CdS material). This means that by including the electrodeposited CdTe sub-layer 34 in the device structure 40, the thickness of the composite CdTe layer 38 may be kept most preferably in the range between 0.6-1.2 micron and still obtain high conversion efficiency solar cells with efficiency values above 10%.

Further embodiments may be used to fabricate devices with a "sub-strate" structure. In CdTe based solar cells, the control of doping, such as Cu doping, is very important. A common approach for Cu-doping as described for example in the Roise-Flores reference mentioned above, as applied to the "super-strate" device structure of FIG. 1A, involves deposition of a thin Cu containing layer on the exposed top surface of the CdTe absorber film 14 before deposition of the contact layer 15. A heat treatment step drives the Cu into the CdTe absorber film 14, doping it. Too little Cu yields low efficiency devices, too much Cu reduces the minority carrier lifetimes in the material and lowers the device efficiency. Therefore, in such an approach the Cu containing layer thickness needs to be controlled to the level of a few angstroms.

Figure 1B:
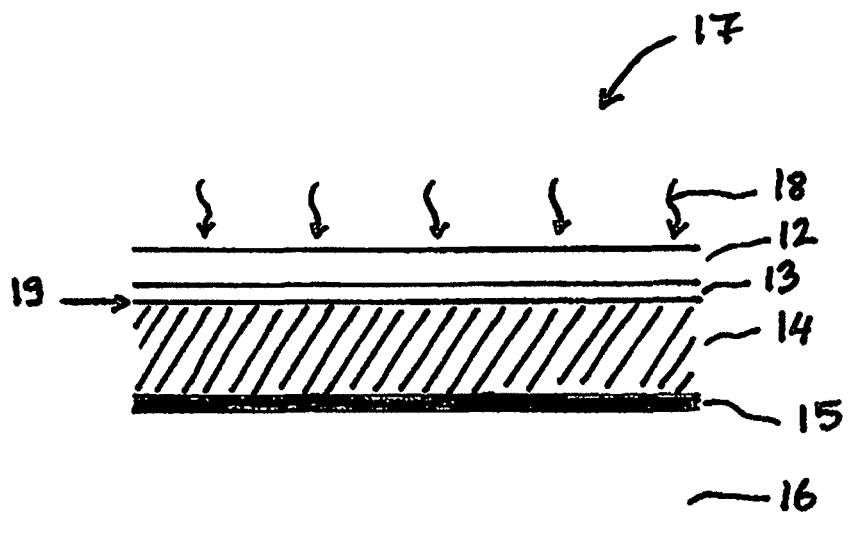
FIG. 1B is a cross-sectional view of a prior art CdTe solar cell with a "sub-strate structure".
Figure 5A:
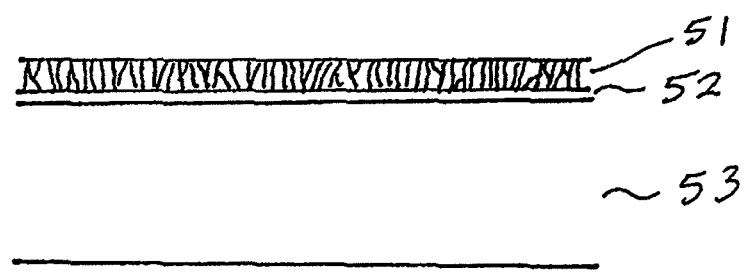
FIG. 5A shows a cross-sectional view of a base coated with a compound interlayer, the base comprising a substrate and a contact film.
Figure 5B:
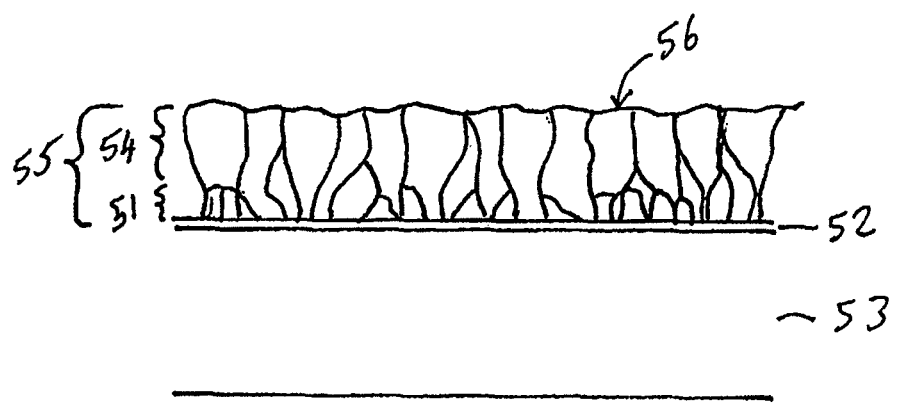
FIG. 5B shows a structure resulting after a Group IIB-VIA compound layer is grown over the compound interlayer of FIG. 5A.

FIGS. 5A and 5B demonstrate an approach which provides an improved Cu doping method to a "sub-strate" device structure while also offering some of the benefits described above in reference to the "super-strate" device structure. In a first step of the process depicted in FIG. 5A, a thin Group IIB-VIA compound containing interlayer 51 is deposited on a contact film 52, which may be previously formed on a surface of a substrate 53. The contact film 52 is analogous to the ohmic contact layer 15 of FIG. 1B, and the substrate 53 is analogous to the sheet substrate 16 of FIG. 1B. The contact film 52 is a conductive layer that makes good ohmic contact to p-type CdTe. The interlayer 51 is preferably doped by a p-type dopant such as Sb, Cu, P and As. The amount of the dopant included in the interlayer 51 is controlled such that it provides the right amount of dopant to a full absorber film when the full absorber film 55 is formed as shown in FIG. 5B. The full absorber film 55 is formed by depositing a top Group IIB-VIA compound layer 54, which may be undoped, on the interlayer 51. During the process of the formation of the top Group IIB-VIA compound layer 54 or after its formation, a temperature of at least 200° C. may be provided for the dopants in the interlayer 51 to diffuse into the top Group IIB-VIA compound layer 54. The device is then finished by depositing a junction partner layer (not shown) and a transparent conductive layer (not shown) over the top surface 56 of the full absorber film 55. As a non-limiting example, the Group IIB-VIA compound containing interlayer 51 and the Group IIB-V1A compound layer 54 may be selected from the of materials shown in the table above wherein the interlayer 51 corresponds to the "sub-layer 34" and the layer 54 corresponds to the "second layer 36" in the table.

One preferred method of deposition of the compound interlayer 51 is electrodeposition. As described before, electrodeposition provides small grained, dense films with highly controlled thickness since the deposition temperature is low and the deposition rate is slow. Therefore, the thickness of the electrodeposited layer can easily be controlled to the level of a few angstroms. Electrodeposited compound interlayer 51 maybe doped during or after the electrodeposition process. During electrodeposition exact amount of dopant can be provided by adding the dopant into the plating electrolyte. For example dopants such as Cu, Sb, and As can easily be electroplated along with Group IIB-VIA compounds such as ZnTe, CdTe or CdZnTe. Since the thickness of the compound interlayer 51 is in the range of 0.005-0.3 microns, preferably in the range of 0.01-0.2 microns, and most preferably in the range of 0.01-0.1 microns, the amount of dopant that is included in such layers are also limited and can be accurately controlled. Methods of inclusion of dopants into the compound interlayer 51 include approaches such as dipping the already deposited compound interlayer 51 in a solution containing the dopant (such as a Cu salt solution). In this case by controlling the thickness of the compound interlayer 51 one automatically controls the maximum amount of dopant that can be included in it. For example, if the compound interlayer 51 is a 0.1 microns thick CdTe, CdZnTe or ZnTe layer then when this layer is doped with Cu through dipping into a Cu solution, the amount of Cu in the doped layer would be limited to an amount that corresponds to the replacement of all Cd and/or Zn atoms in the compound interlayer 51 with Cu through an exchange reaction that is expected to take place if the pH of the Cu solution is acidic. Therefore, the thickness of the compound interlayer 51 may be selected so that the maximum amount of dopant that can be accommodated in the compound interlayer 51 corresponds to an optimum dopant level in the top Group IIB-VIA compound layer 54 when the dopant is diffused from the compound interlayer 51 into the top Group IIB-VIA compound layer 54. If the compound interlayer 51 contains materials with bandgap values larger than the top Group IIB-VIA compound layer 54, then an electron reflector is also provided at the location of the compound interlayer 51. For example, the compound interlayer 51 may comprise materials such as Zn, Mg, and Mn in addition to Te and possibly Cd to provide an electron reflector for the top Group IIB-VIA compound layer 54, which may comprise, for example, CdTe or CdZnTe. Besides being a dopant source and/or electron reflector to the top Group IIB-VIA compound layer 54, the compound interlayer 51 also provides a fresh compound surface onto which the top Group IIB-VIA compound layer 54 can nucleate and grow efficiently even if its thickness is below 2.5 microns. For example, by providing the compound interlayer 51 over the contact film 52, one can form a top Group IIB-VIA compound layer 54 that is thin (e.g. less than about 1.5 microns) but still structurally compact and dense.

Although certain preferred embodiments have been described, modifications thereto will be apparent to those skilled in the art.

What is claimed:

1. A method of fabricating a solar cell on a base comprising;
    electrodepositing a Group IIB-VIA material containing sub-layer over the base at a temperature below 100° C.; and
    forming a second layer comprising a second Group IIB-VIA substance on the sub-layer, wherein:
    the sub-layer and the second layer together constitute a composite layer;
    the Group IIB-VIA material containing sub-layer comprises Te and at least one of Cd, Zn, Mn and Mg, and further comprises a p-type dopant selected from the group consisting of Cu, Sb, As and P;
    the second Group IIB-VIA substance comprises CdTe; and
    the step of forming the second layer is carried out at or above a temperature of 200° C. so that the p-type dopant diffuses from the Group IIB-VIA material containing sub-layer into the second layer thus yielding a doped composite layer.

2. The method as recited in claim 1 wherein the base comprises a transparent sheet and a transparent conductive layer provided on the transparent sheet, and the method further comprises:
    forming a junction partner layer formed over the transparent conductive layer; and
    wherein the Group IIB-VIA material containing sub-layer is deposited on the surface of the junction partner layer.

3. The method as recited in claim 1 further comprising a step of treating the Group IIB-VIA material containing sub-layer after the step of electrodepositing and before the step of forming the second layer wherein the step of treating comprises performing an oxidation process.

4. The method as recited in claim 3 wherein the oxidation process comprises annealing in an oxidizing atmosphere at a temperature range of 250-550° C. and the step of forming the second layer comprises heat treating the second layer in presence of a halide selected from the group of Cl, I and Br.

5. The method as recited in claim 1 wherein the thickness of the Group IIB-VIA material containing sub-layer is in the range of 0.001-1 microns.

6. The method as recited in claim 5 wherein the thickness of the second layer is in the range of 0.2-2 microns.

7. The method as recited in claim 1 wherein the base comprises a substrate coated with a conductive contact film, and wherein the Group IIB-VIA material containing sub-layer is deposited on the surface of the conductive contact film.

8. The method as recited in claim 7 wherein the thickness of the Group IIB-VIA material containing sub-layer is in the range of 0.005-0.3 microns.

9. The method as recited in claim 1 wherein forming the second layer is performed using one of vapor deposition and ink deposition.

10. The method as recited in claim 9 wherein forming the second layer is performed using a temperature in excess of 400° C.

11. A solar cell fabricated according to the method of claim 1.

* * * * *